United States Patent [19]

Wrathall

[11] 4,453,095
[45] Jun. 5, 1984

[54] ECL MOS BUFFER CIRCUITS
[75] Inventor: Robert S. Wrathall, Tempe, Ariz.
[73] Assignee: Motorola Inc., Schaumburg, Ill.
[21] Appl. No.: 399,028
[22] Filed: Jul. 16, 1982
[51] Int. Cl.$^3$ .................. H03K 19/092; H03K 19/086; H03K 19/094
[52] U.S. Cl. .................................... 307/475; 307/446
[58] Field of Search ............... 307/475, 264, 446, 451, 307/455

[56] References Cited
U.S. PATENT DOCUMENTS
3,959,666  5/1976  Fett et al. ........................... 307/475
3,974,402  8/1976  Fett et al. ........................... 307/475
4,366,397 12/1982  Kitamura et al. ............... 307/446 X OTHER PUBLICATIONS
Froment and Marijon, "ECL to TTL Translator Driver", *IBM Tech. Disc. Bull.*, vol. 21, No. 10, 3/1979, pp. 4074–4075.
Hansen and Lane, "Bipolar Driver for Interfacing Bipolar and FET Circuits", *IBM Tech. Disc. Bull.*, vol. 15, No. 1, 6/1972, pp. 41–42.

Primary Examiner—Larry N. Anagnos
Assistant Examiner—David R. Hudspeth
Attorney, Agent, or Firm—William J. Kubida

[57] ABSTRACT

An input buffer to which an ECL logic swing is applied through a voltage level shifter to one input of a differential pair of switching devices, the other input of the differential pair being a voltage level shifted by the same amount from an ECL logic reference voltage. The output across a load device coupling one of the switching devices to a collector voltage source drives the input of a conventional inverter coupling a reduced MOS logic voltage supply to the collector voltage source. An output buffer to which a reduced MOS voltage swing logic input is applied to the input of a conventional inverter coupling a reduced MOS logic voltage supply to a collector voltage source. The output of the inverter is applied to one input of a differential pair of switching devices having the other input thereto held at a reference level defined by a voltage divider. The output of the differential pair across a load device coupling one of the switching devices to the collector voltage source is level shifted through another switching device to the circuit output.

16 Claims, 4 Drawing Figures 4,453,095

ECL MOS BUFFER CIRCUITS

BACKGROUND OF THE INVENTION

The subject matter of the present invention relates to input and output buffer circuits. More particularly, the present invention relates to such buffer circuits having a special utility in the interfacing of CMOS circuitry with associated ECL devices.

An ideal digital logic device would have the characteristics of an infinite input impedance as well as a zero output impedance. Moreover, this ideal digital logic device would have a zero propagation delay and power dissipation. With existing technologies, ECL and MOS most nearly approximate the desired infinite input impedance. Additionally, both technologies are fast and about equally satisfy the requirement of zero propagation delay. However, only ECL technologies can approach the zero output impedance requirement while only CMOS comes close to the requirement of zero power dissipation. Resultantly, the combination of ECL and CMOS technologies produce as nearly a perfect logic technology as is available today.

Therefore, ECL MOS technologies have substantial advantages over either technology alone when dealing with nanosecond edge rates and propagation delays. Both ECL and MOS technologies manufacture logic that is capable of this performance between on-chip gates. In addition, ECL is adapted to driving low impedance lines off-chip in a system environment, but does so at the expense of power dissipation. MOS technology has a large advantage with low power consumption but has substantial difficulties in the off-chip, low impedance line environment.

More particularly, low voltage silicon gate CMOS technology is noted for its speed, packing density, and low power dissipation. Disadvantages with CMOS technology lie in its inability to drive lines in a high speed system environment where 50 to 100 ohm line drivers are necessary. In general however, ECL does not pack as well as CMOS and dissipates considerably more power. ECL also has an advantage in the existence of a very large family of fast "glue" MSI to couple large systems together.

There have previously been reported devices attempting to merge ECL and CMOS technologies to take advantage of the inherently desirable aspects of each. See for example Yu et al "C-MOS Static RAM Feels at Home With ECL Speeds" *Electronics*, Feb. 10, 1982 at pp. 160–163. In this regard, ECL input and output buffers have been provided for a CMOS circuit device. However, the input buffer to such circuitry has been relatively complex and power hungry in its adaptation of a conventional −0.7 to −1.9 ECL logic level to a conventional 0 to −5.2 volts CMOS logic level. Propagation delays of up to 4.5 nanoseconds have been reported in the amplification and level shift between the ECL and CMOS logic levels. Moreover, the propagation delays and power comsumption reported have been due primarily to the disparate nature of these two logic levels since the CMOS circuitry is operated at a full five volt logic swing. Moreover, the conventional five volt CMOS logic swing causes known problems when dealing with fine line device geometries of one micron or less. These disadvantages include an increased susceptibility to punchthrough and undesirable short channel effects.

Although in utilizing the conventional five volt logic swing for the CMOS devices, the ECL output buffer circuit is considerably simplified, the overriding benefits to be derived from using a lesser CMOS logic swing by simplification of the associated ECL input buffer greatly outweigh the necessity of a somewhat more complex ECL output buffer with the lower voltage CMOS logic swing.

It would therefore be highly desirable to provide improved ECL MOS buffer circuits.

It would further be highly desirable to provide improved ECL CMOS buffer circuits which can adapt an ECL logic swing to a lower voltage CMOS logic swing.

It would still further be highly desirable to provide improved ECL MOS buffer circuits which minimize propagation delay and power dissipation.

SUMMARY OF THE INVENTION

The foregoing objects are achieved in the present invention wherein an input buffer is provided to which an ECL logic swing is applied through a voltage level shifter to one input of a differential pair of switching devices, the other input to the differential pair being a voltage level shifted by the same amount from an ECL logic reference voltage. The output across a load device coupling one of the switching devices to a collector voltage source is drives the input of a conventional inverter coupling a reduced MOS logic voltage supply to the collector voltage source.

Also provided is an output buffer circuit to which a reduced MOS voltage swing logic input is applied to the input of a conventional inverter coupling a reduced MOS logic voltage supply to a collector voltage source. The output of the inverter is applied to one input of a differential pair of switching devices having the other input thereto held at a reference level defined by a voltage divider. The output of the differential pair across a load device coupling one of the switching devices to the collector voltage source is level shifted through another switching device to the circuit output.

BRIEF DESCRIPTION OF THE DRAWINGS

The above-mentioned and other features and objects of the invention and the manner of attaining them will become more apparent and the invention itself will be best understood by reference to the following description of an embodiment of the invention taken in conjunction with the accompanying drawings, wherein.

DESCRIPTION OF A PREFERRED EMBODIMENT

Figure 1A:
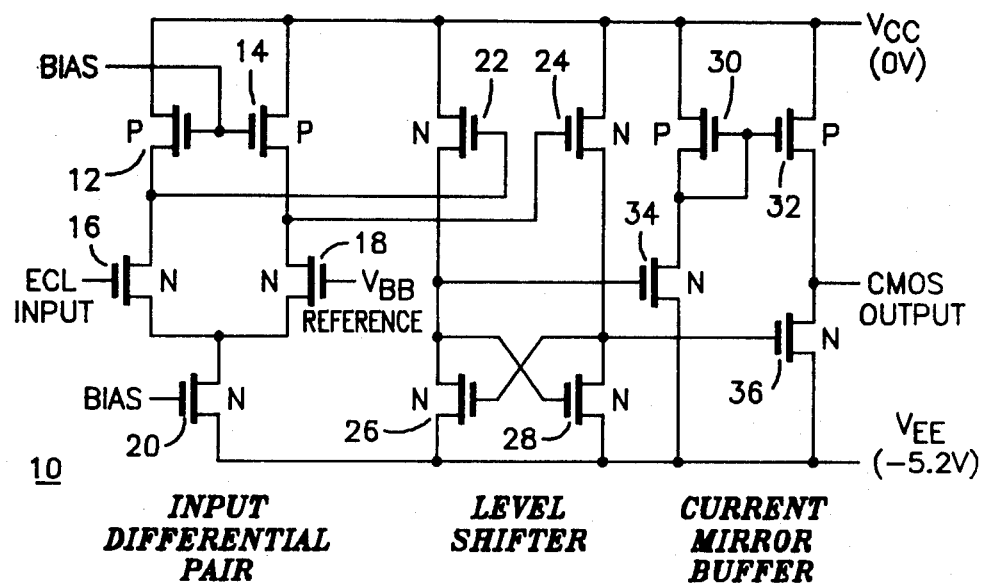
FIGS. 1A and 1B respectively are schematic representations of previously described input and output buffers for interfacing an ECL logic swing with associated CMOS circuitry having a conventional logic swing.

The previously described input buffer 10 of FIG. 1A converts an input logic signal at ECL levels to a conventional CMOS level. An ECL logic level is applied to the gate of N channel transistor 16, which, with N channel transistor 18 comprises a differential pair. A conventional ECL reference voltage ($V_{BB}$) is applied to the gate of N channel transistor 18. The common sources of N channel transistors 16 and 18 are connected to the drain of N channel transistor 20 having its source coupled to a conventional ECL power supply emitter voltage ($V_{EE}$) of 5.2 volts. The drain contacts of N channel transistors 16 and 18 are respectively coupled to the drain contacts of P channel transistors 12 and 14 having their common source contacts connected to a collector voltage ($V_{CC}$) of zero volts or circuit ground. As shown, a bias signal is applied to the common gates of P channel transistors 12 and 14 as well as to the gate of N channel transistor 20.

Outputs appearing at the drain contacts of N channel transistors 16 and 18 are applied respectively to the gates of N channel transistors 22 and 24 in a second level shifter stage. The drain contacts of N channel transistors 22 and 24 are common and coupled to $V_{CC}$. The source contacts of N channel transistors 22 and 24 are applied respectively to the drains of N channel transistors 26 and 28 having their common sources connected to $V_{EE}$. As shown, the drain of N channel transistor 26 is connected to the gate of N channel transistor 28 having its drain connected to the gate of N channel transistor 26.

Output from the level shifter portion of this previously described input buffer 10 appearing at the drains of N channel transistors 26 and 28 are respectively connected to the gates of N channel transistors 34 and 36. As shown, the drain of N channel transistor 36 is connected to the drain of P channel transistor 32 having its source connected to $V_{CC}$. Similarly, the drain of N channel transistor 34 is connected to the drain of P channel transistor 30 having its source also connected to $V_{CC}$. The common gates of P channel transistors 30 and 32 are connected to the drain of N channel transistor 34. The output of this current mirror buffer portion of the previously described input buffer 10 appears at the drain of N channel transistor 36.

In operation, the differential pair comprising N channel transistors 16 and 18 is used to provide initial voltage gain and a comparison to the proper switch point reference voltage $V_{BB}$. The cross coupled N channel transistors 26 and 28 in the second stage provide additional gain and also shift the levels downward. The third, current mirror buffer stage provides full MOS level swings to subsequent circuits. Delay times for the ECL to MOS conversion experienced with the previously described input buffer 10 are on the order of 4.5 nanoseconds. In one application of this previously described input buffer 10 in which 15 input converters were required, 65% of the total chip power had to be allocated to them.

Figure 1B:
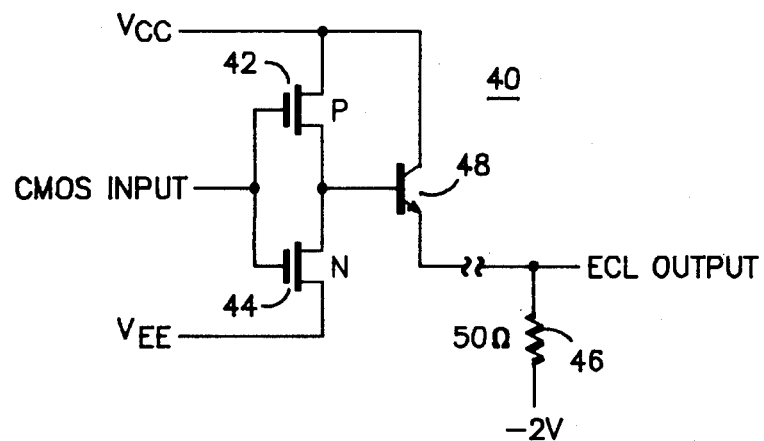

Referring now to FIG. 1B, a previously described output buffer 40 is shown. Previously described output buffer 40 includes a conventional CMOS inverter comprising P channel transistor 42 having a common drain contact with N channel transistor 44. A CMOS logic input is applied to the common gates of P channel transistor 42 and N channel transistor 44. The source of P channel transistor 42 is connected to $V_{CC}$. The source of N channel transistor 44 is connected to $V_{EE}$. Output from the inverter comprising P channel transistor 42 and N channel transistor 44 is applied to the base of an NPN transistor 48, having its collector connected to $V_{CC}$. An ECL logic swing output appears at the emitter of NPN transistor 48 as coupled to a $-2$ volts through resistor 46.

Conversion from a conventional CMOS logic level to the ECL level is done by means of previously described output buffer 40. P channel transistor 42 is a relatively large device for driving the base of NPN transistor 48 to provide the correct output high voltage and current. The output low level is supplied by the terminating resistor 46 tied to a $-2$ volts.

Figure 2A:
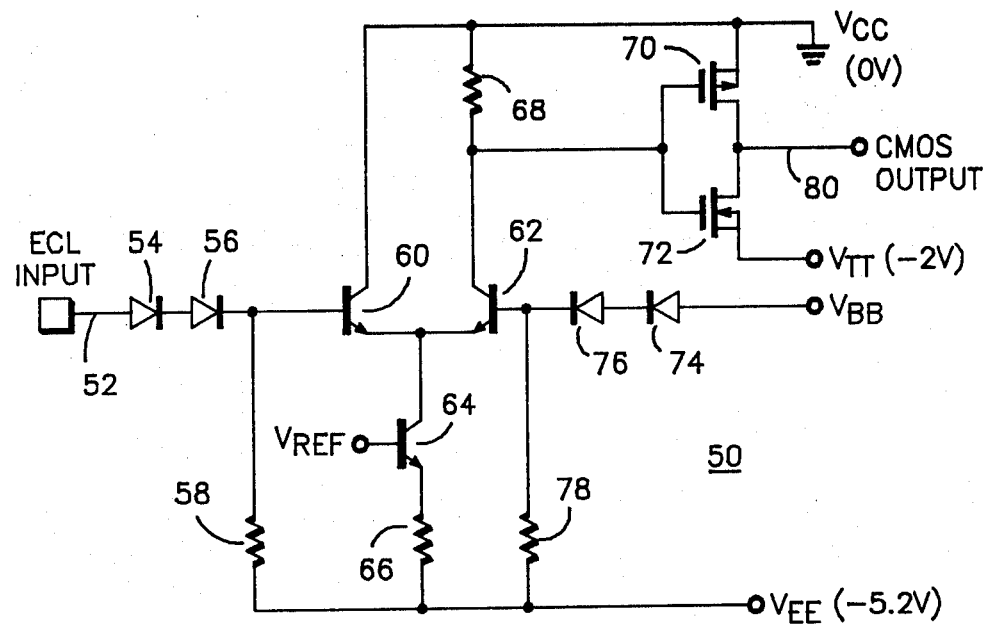
FIGS. 2A and 2B respectively are schematic representations of an input and output buffer according to the present invention for interfacing an ECL logic swing with CMOS circuitry having a reduced logic swing.

Referring now to FIG. 2A, an ECL MOS input buffer 50 is shown. An ECL input level is applied to ECL input line 52 for input to ECL MOS input buffer 50. Diodes 54 and 56 in conjunction with resistor 58 provide a level shifter function between an emitter voltage supply ($V_{EE}$) of $-5.2$ volts and the input to the base of bipolar transistor 60. Bipolar transistors 60 and 62 comprise a differential pair serving a current switching function. The common emitter terminals of bipolar transistors 62 and 64 are coupled to $V_{EE}$ through bipolar transistor 64 and resistor 66. A voltage $V_{REF}$ is applied to the base of bipolar transistor 64. In combination, bipolar transistor 64 and resistor 66 comprise a current source.

The collector of bipolar transistor 60 is connected to a collector voltage ($V_{CC}$) of zero volts or circuit ground. The collector of bipolar transistor 62 is coupled to $V_{CC}$ through resistor 68.

An ECL logic threshold reference voltage ($V_{BB}$) is applied through diodes 74 and 76 to the base of bipolar transistor 62. Additionally, the base of bipolar transistor 62 is coupled to $V_{EE}$ through resistor 78. Together, diodes 74, 76 and resistor 78 provide a voltage level shifting function for applying the ECL logic threshold reference voltage $V_{BB}$ to the base of bipolar transistor 62.

The output of ECL MOS input buffer 50 is taken across resistor 68 at the collector of bipolar transistor 62. This output is applied to the input of a conventional CMOS inverter comprising P channel transistor 70 and N channel transistor 72. As shown, the source of P channel transistor 70 is connected to $V_{CC}$ while the source of N channel transistor 72 is connected to a standard ECL supply voltage ($V_{TT}$) of $-2$ volts. This $-2$ volt voltage then defines the logic swing for the subsequent CMOS circuitry giving a logic level of between zero and $-2$ volts. The output to this subsequent CMOS circuitry is found at the common drains of P channel transistor 70 and N channel transistor 72 on CMOS output line 80.

In operation, ECL MOS input buffer 50 amplifies a signal from the approximately one volt ECL logic swing ($-0.7$ to $-1.9$ volts) to the new 2 volt CMOS logic swing (0 to $-2.0$ volts). At the same time, the signal is level shifted to the upper rail at $V_{CC}$. This shift operation is accomplished by ECL MOS input buffer 50. As shown, $V_{BB}$ is the logic threshold level generated for ECL circuits. A diode level shifter comprising diodes 74 and 76 connected to $V_{BB}$ adds to the maximum voltage swing at the collector of bipolar transistor 62 before the transistor saturates. The collector voltage swing is determined by the ratio of resistors 68 and 66 and the reference voltage ($V_{REF}$).

Figure 2B:
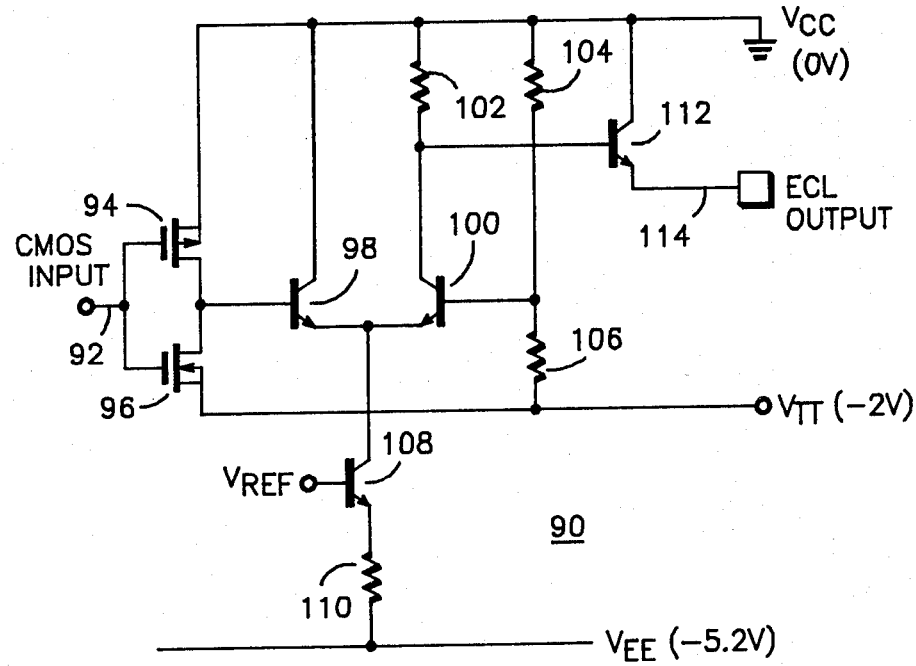

Referring now to FIG. 2B, ECL MOS output buffer 90 is shown. A CMOS logic swing of two volts appearing on CMOS input line 92 is applied to the common gates of a conventional CMOS inverter comprising P channel transistor 94 and N channel transistor 96. As shown, the source of P channel transistor 94 is connected to $V_{CC}$, while the source of N channel transistor 96 is connected to $V_{TT}$. The common drains of P channel transistor 94 and N channel transistor 96 are connected to the base of bipolar transistor 98 comprising with bipolar transistor 100 a differential pair serving a current switching function. The common emitters of bipolar transistors 98 and 100 are coupled to $V_{EE}$ through bipolar transistor 108 and resistor 110. $V_{REF}$ is applied to the base of bipolar transistor 108. Together, bipolar transistor 108 and resistor 110 serve as a current source.

The collector of bipolar transistor 98 is connected to $V_{CC}$ while the collector of bipolar transistor 100 is coupled to $V_{CC}$ through resistor 102. The base of bipolar transistor 100 is biased by means of resistors 104 and 106 serving a voltage dividing function as coupled between $V_{TT}$ and $V_{CC}$.

The output of ECL MOS output buffer appearing on ECL output line 114 is tapped across resistor 102 through bipolar transistor 112. The base of bipolar transistor 112 is connected to the collector of bipolar transistor 100. The collector of bipolar transistor 112 is connected to $V_{CC}$. ECL output line 114 is connected to the emitter of bipolar transistor 112 in its emitter follower configuration.

The CMOS logic swing of two volts on CMOS input line 92 works between ground and the $-2$ volts $V_{TT}$ of the standard ECL technology. The CMOS logic swing input drives the base of bipolar transistor 98 connected as a differential pair to bipolar transistor 100. This causes a one volt swing from ground across resistor 102 which drives the emitter follower configured bipolar transistor 112 which in turn drives ECL output line 114. The base of bipolar transistor 100 is tied slightly below $-1$ volt by means of a resistor voltage divider network comprising resistors 104 and 106 to generate a threshold point.

The circuit design of ECL MOS input buffer 50 and ECL MOS output buffer 90 is neatly balanced. Short channel CMOS works best at a low voltage. A 2 volt logic swing allows sufficient margin for the CMOS to work at 0.5 volt threshold. It should be noted, that a CMOS logic swing of up to and including 3 volts is possible utilizing the circuitry shown, although the 2 volt logic swing was chosen due to the conventional ECL supply voltage $V_{TT}$.

What has been provided therefore is an improved ECL MOS buffer circuit which can adapt an ECL logic swing to a lower voltage CMOS logic swing. Also, the improved ECL MOS buffer circuits of the present invention minimize propagation delay and power dissipation.

While there have been described above the principles of this invention in conjunction with specific circuitry, it is to be clearly understood that this description is made only by way of example and not as a limitation to the scope of the invention.

I claim:

1. An input buffer for converting a first logic voltage signal having a respective logic high level and a logic low level present on an input line to a second logic voltage signal having a respective logic high level and a logic low level present on an output line, wherein the voltage difference between said first signal high level and low level is different from the voltage difference between said second signal high level and low level, said respective logic high levels being substantially the same, comprising:

first and second switching devices having common emitter contacts and respective first and second collector and base contacts thereof, said first and second collector contacts being respectively connected to a collector voltage source line and an output node, a current source coupling said common emitter contacts to an emitter voltage source line, first and second level shifting means for coupling said input line and a logic reference voltage respectively to said emitter voltage source line for biasing said first and second base contacts, a load device coupling said output node to said collector voltage source line, and a logic inverter coupling a supply voltage line to said collector voltage source line and having input and output terminals thereof, said input terminal being connected to said output node and said output terminal being said output line.

2. The input buffer of claim 1, wherein said first and second switching devices are NPN bipolar transistors.

3. The input buffer of claim 1 wherein said current source comprises a resistor and a series connected transistor having a reference voltage input thereto.

4. The input buffer of claim 3 wherein said series connected transistor is a bipolar transistor.

5. The input buffer of claim 1 wherein said first and second level shifting means comprise series connected diodes.

6. The input buffer of claim 1 wherein said load device is a resistor.

7. The input buffer of claim 1 wherein said logic inverter comprises a CMOS inverter.

8. The logic inverter of claim 1 wherein said supply voltage on said supply voltage line is substantially minus two volts with respect to said collector voltage source line.

9. An output buffer for converting a first logic voltage signal having a respective logic high level and a logic low level present on an input line to a second logic voltage signal having a respective logic high level and a logic low level present on an output line, wherein the voltage difference between said first signal high level and low level is different from the voltage difference between said second signal high level and low level, said respective logic high levels being substantially the same, comprising:

first and second switching devices having common emitter contacts and first and second collector and base contacts respectively, said first and second collector contacts being respectively connected to a collector voltage source node and an output node, a current source coupling said common emitter contacts to an emitter voltage source node, a load device coupling said output node to said collector voltage source node, a logic inverter coupling a supply voltage node to said collector voltage source node and having input and output terminals thereof, said input terminal being said input line and said output terminal connected to said first base contact, a voltage divider coupling said supply voltage node to said collector voltage source node for biasing said second base contact, a third switching device having third collector, base and emitter contacts respectively connected to said collector voltage source node, said output node and said output line.

10. The output buffer of claim 9 wherein said first, second and third switching devices are NPN bipolar transistors.

11. The output buffer of claim 9 wherein said current source comprises a resistor and a series connected transistor having a reference voltage input thereto.

12. The output buffer of claim 11 wherein said series connected transistor is a bipolar transistor.

13. The output buffer of claim 9 wherein said logic inverter comprises a CMOS inverter.

14. The output buffer of claim 9 wherein said supply voltage at said supply voltage node is substantially $-2$ volts with respect to said collector voltage source line.

15. The output buffer of claim 9 wherein said load device is a resistor.

16. The output buffer of claim 9 wherein said voltage divider comprises series connected resistors.

* * * * *